(12) United States Patent
Park et al.

(10) Patent No.: US 11,640,030 B2
(45) Date of Patent: May 2, 2023

(54) OPTICAL PHASED ARRAY CHIP USING MEMS SWITCH AND MANUFACTURING METHOD THEREOF

(71) Applicants: Korea Advanced Institute of Science and Technology, Daejeon (KR); Gwangju Institute of Science and Technology, Gwangju (KR)

(72) Inventors: Hyo-Hoon Park, Daejeon (KR); Jong-Bum You, Daejeon (KR); Dong-Eun Yoo, Daejeon (KR); Ju-Beom Lee, Daejeon (KR); In Ki Kim, Gwangju (KR); Tae Joon Seok, Gwangju (KR); Geumbong Kang, Daejeon (KR); Hyeonho Yoon, Daejeon (KR); Nam-Hyun Kwon, Daejeon (KR)

(73) Assignees: KOREA ADVANCED INSTITUTE OF SCIENCE AND TECHNOLOGY, Daejeon (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 17/576,212

(22) Filed: Jan. 14, 2022

(65) Prior Publication Data
US 2022/0229233 A1    Jul. 21, 2022

(30) Foreign Application Priority Data
Jan. 19, 2021    (KR) .................. 10-2021-0007201

(51) Int. Cl.
*G02B 6/12* (2006.01)
*G02B 6/136* (2006.01)
*B81B 3/00* (2006.01)

(52) U.S. Cl.
CPC ........ *G02B 6/12011* (2013.01); *B81B 3/0029* (2013.01); *G02B 6/1203* (2013.01);
(Continued)

(58) Field of Classification Search
CPC ............ G02B 6/12011; G02B 6/12004; G02B 6/12021; G02B 6/1203; G02B 6/136; G02B 6/29301; G02B 6/3562; G02B 6/3584; G02B 6/3508; G02B 6/12033; G02B 6/122; G02B 2006/12145; G02B 2006/12147;
(Continued)

(56) References Cited

U.S. PATENT DOCUMENTS

| 8,909,003 | B1 * | 12/2014 | Hochberg .......... G01R 29/0885 385/12 |
| 2022/0229233 | A1 * | 7/2022 | Park ...................... B81B 3/0029 |

* cited by examiner

*Primary Examiner* — Andrew Jordan
(74) *Attorney, Agent, or Firm* — Burns & Levinson, LLP; Joseph M. Maraia

(57) ABSTRACT

Disclosed are an optical phased array chip and a method of manufacturing the same. The optical phased array chip includes a plurality of optical switches and a plurality of optical phased arrays implemented on a single integrated circuit, wherein the single integrated circuit includes a silicon substrate, a lower layer formed on an upper portion of the silicon substrate, a silicon layer formed on an upper portion of the lower layer, a first upper layer, a second upper layer and a third upper layer sequentially arranged on the silicon layer, and an electrode that penetrates through the first upper layer while being grounded to the silicon layer and is formed on an upper portion of the first upper layer.

12 Claims, 11 Drawing Sheets

(52) U.S. Cl.
CPC ..... *G02B 6/12004* (2013.01); *G02B 6/12021* (2013.01); *G02B 6/136* (2013.01); *B81B 2201/045* (2013.01); *G02B 2006/1215* (2013.01); *G02B 2006/12145* (2013.01); *G02B 2006/12147* (2013.01)

(58) Field of Classification Search
CPC .. G02B 2006/1215; G02B 2006/12061; G02B 2006/12166; B81B 3/0029; B81B 2201/045
See application file for complete search history.

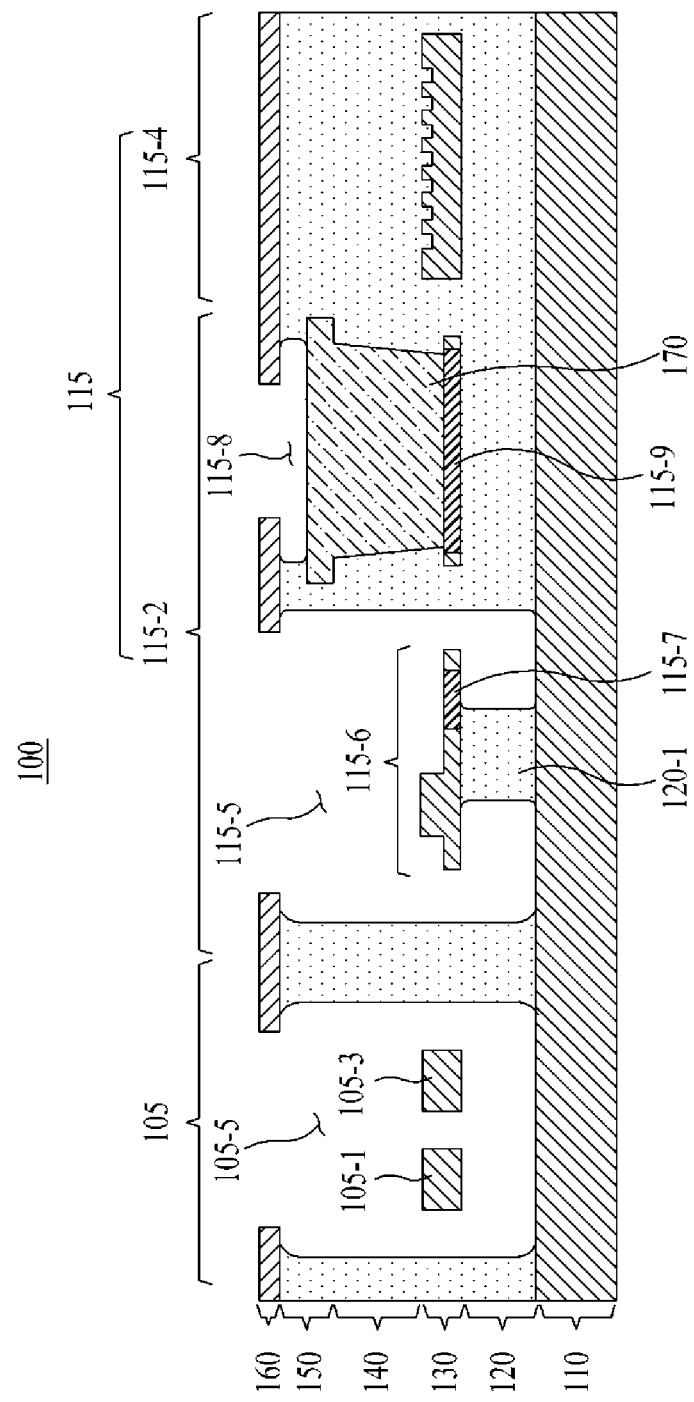

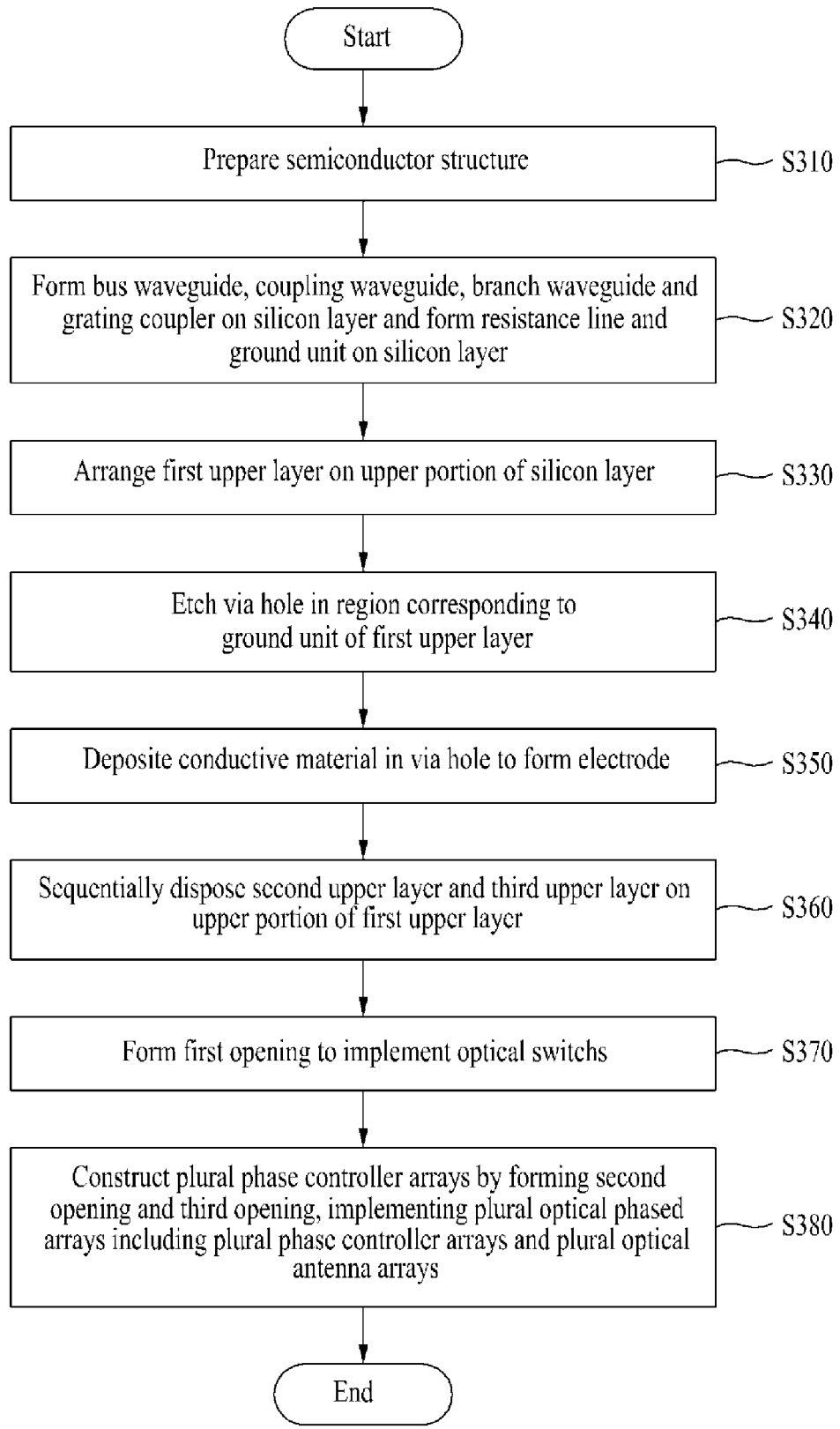

OPTICAL PHASED ARRAY CHIP USING MEMS SWITCH AND MANUFACTURING METHOD THEREOF

CROSS-REFERENCE TO RELATED APPLICATIONS

A claim for priority under 35 U.S.C. § 119 is made to Korean Patent Application No. 10-2021-0007201 filed on Jan. 19, 2021, in the Korean Intellectual Property Office, the entire contents of which are hereby incorporated by reference.

BACKGROUND

Embodiments of the inventive concept described herein relate to an optical phased array chip for controlling the directivity and directionality of light and a method of manufacturing the same.

An optical phased array may control the directionality of light emitted from the optical antenna array by controlling the phase of optical waves branching into multiple channels and guided, or may selectively receive light incident on the optical antenna array according to the directionality.

Such an optical phased array may include optical waveguide-based unit devices implemented on a silicon on insulator (SOI) substrate. In more detail, the optical phased array may include a grating coupler for input coupling with an external light source while being implemented with a 1×N scale, an optical power splitter for splitting the coupled optical waves into N channels, an N-channel phase shifter array for controlling the phase of the optical wave guiding in each channel, and an N-channel optical radiation antenna array for optical emission and reception. Accordingly, the 1×N optical phased array, which is a one-dimensional array structure, may scan the emitted beam in the transversal direction through phase control.

Such a one-dimensional optical phased array may control the longitudinal direction of the emitted beam by changing the wavelength or changing the refractive index of the optical antenna region, but the range of controlling the longitudinal steering angle is limited.

Therefore, to solve the above shortcomings, a two-dimensional optical phased array structure of M×(1×N) scale for expanding the longitudinal directionality range has been proposed. The corresponding structure allows M one-dimensional optical phased arrays to have different longitudinal orientation angles, thereby expanding the longitudinal directionality range M times than that of a linear one-dimensional array. Such a conventional two-dimensional optical phased array structure technology requires an optical switch to selectively select M optical phased arrays. The control of a switching function mainly uses a scheme of changing the refractive index by an electro-optic (EO) effect or a scheme of changing the refractive index by a thermo-optic (TO) effect.

However, because the electro-optical or thermal-optical optical switches are limited by optical crosstalk, the conventional two-dimensional optical phased array is disadvantageous in thermal isolation between channels.

Accordingly, there is a need to propose a technique for overcoming the limitations of the existing two-dimensional optical phased array.

SUMMARY

Embodiments of the inventive concept provide an optical phased array chip of a two-dimensional optical phased array that utilizes a micro electro mechanical system (MEMS) optical switch in order to expand the longitudinal emission angle of a beam while overcoming a limitation of a two-dimensional optical phased array utilizing conventional optical switches of an electro-optic or thermo-optic scheme, and a method of manufacturing the same.

In detail, embodiments of the inventive concept provide an optical phased array chip that includes a plurality of optical phased arrays including a plurality of MEMS-based optical switches implemented on a single integrated circuit and a plurality of thermal-isolated phase controller arrays, and a method of manufacturing the same.

In this case, a method of manufacturing an optical phased array chip according to embodiments applies a local release process limited to a plurality of optical switches and a plurality of phase controller arrays in order to prevent unnecessary performance degradation by applying an release process to components that do not require release formation, such as a light splitter and a plurality of optical antenna arrays when the optical phased array chip is manufacture.

In addition, an optical phased array chip according to embodiments has a resistor buried phase control structure in which thermal isolation of the release regions formed in the plurality of phase controller arrays is implemented in order to minimize thermal interference and suppress unnecessary thermal conduction to improve phase control efficiency.

According to an exemplary embodiment, an optical phased array chip includes a plurality of optical switches and a plurality of optical phased arrays implemented on a single integrated circuit, wherein the single integrated circuit includes a silicon substrate, a lower layer formed on an upper portion of the silicon substrate, a silicon layer formed on an upper portion of the lower layer, a first upper layer, a second upper layer and a third upper layer sequentially arranged on the silicon layer, and an electrode that penetrates through the first upper layer while being grounded to the silicon layer and is formed on an upper portion of the first upper layer.

According to an embodiment, the plurality of optical switches may be connected in series with a bus waveguide through which an input optical wave proceeds, and each of the plurality of optical switches may include an MEMS actuator, a coupling waveguide driven by the MEMS actuator, and a branch waveguide that transmits the optical wave to each of the plurality of optical phased arrays in response to the coupling waveguide being driven.

According to an embodiment, the coupling waveguide and the branch waveguide included in each of the bus waveguide and the plurality of optical switches may be formed on the silicon layer in a first opening in which the first upper layer, the second upper layer and the third upper layer are etched.

According to an embodiment, the coupling waveguide may transmit an optical wave propagating to the bus waveguide through a first optical coupling to the coupling waveguide, and transmit the optical wave transmitted through a second optical coupling to the coupling waveguide to each of the plurality of optical phased arrays as the coupling waveguide approaches the bus waveguide and the branch waveguide by the MEMS actuator.

According to an embodiment, each of the plurality of optical phased arrays may include an optical splitter that splits an optical wave transmitted from each of the plurality of optical switches, a plurality of phase controller arrays that receives the optical waves branched by the optical splitter, respectively to control a phase, a connection unit that transmits optical waves output from the plurality of phase controller arrays to a plurality of optical antenna arrays, and the plurality of optical antenna arrays that radiates the optical waves transmitted by the connection unit according to a preset longitudinal steering range.

According to an embodiment, each of the plurality of phase controller arrays may include a rib waveguide and a resistance line formed on the silicon layer in a second opening in which the first upper layer, the second upper layer and the third upper layer are etched, the electrode formed on an upper portion of the first upper layer in a third opening in which the second upper layer and the third upper layer are etched, and a ground unit formed on the silicon layer to connect the electrode and the resistance line.

According to an embodiment, a width of the electrode and a width of a portion of the second upper layer which is etched in the third opening may be wider than a width of a portion of the third upper layer which is etched in the third opening to ground the electrode.

According to an embodiment, each of the plurality of phase controller arrays may have a resistor buried phase control structure in which the rib waveguide and the resistance line are buried in the second opening for thermal isolation of each of the plurality of phase controller arrays.

According to an embodiment, each of the plurality of optical antenna arrays may be configured with a grating coupler formed on the silicon layer.

According to an embodiment, each of the plurality of optical antenna arrays may adjust lateral directionality of a divergent beam formed by the optical waves according to a phase relationship between the plurality of phase controller arrays.

According to an embodiment, the third upper layer may be used as a passivation layer for protecting areas other than a first opening, a second opening and a third opening on the single integrated circuit in a process of etching the first opening in which the plurality of optical switches are formed, the second opening and the third opening in which the plurality of optical phased arrays are formed.

According to another exemplary embodiment, a method of manufacturing an optical phased array chip includes preparing a semiconductor structure including a silicon substrate, a lower layer formed on an upper portion of the silicon substrate, and a silicon layer formed on an upper portion of the lower layer, forming a bus waveguide, a coupling waveguide, a branch waveguide, a rib waveguide, and a grating coupler on the silicon layer, forming a resistance line and a ground unit in a slab region on the silicon layer through an ion implantation process, disposing a first upper layer on an upper portion of the silicon layer, forming a via hole by etching an area corresponding to the ground unit of the first upper layer, forming an electrode by depositing a conductive material in the via hole, sequentially disposing a second upper layer and a third upper layer on an upper portion of the first upper layer in which the electrode is formed, implementing a plurality of optical switches each including the bus waveguide, the coupling waveguide, and the branch waveguide by forming a first opening by etching areas corresponding to the bus waveguide, the coupling waveguide and the branch waveguide among the third upper layer, the second upper layer and the first upper layer, and implementing a plurality of optical phased arrays each including a plurality of phase controller arrays and a plurality of optical antenna arrays by forming the plurality of phase controller arrays each including the rib waveguide, the resistance line, the electrode, and the ground unit, and by forming the plurality of optical antenna arrays each including the grating coupler, wherein areas corresponding to the rib waveguide and the resistance line among the third upper layer, the second upper layer and the first upper layer are etched to form a second opening, and wherein areas corresponding to the electrode and the ground unit of the second upper layer and the third upper layer are etched to form a third opening.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 1B is a side cross-sectional view of an optical phased array chip taken along a cutting line denoted in FIG. 1A;

FIG. 3 is a flowchart illustrating a method of manufacturing an optical phased array chip according to an embodiment.

DETAILED DESCRIPTION

Figure 1A:
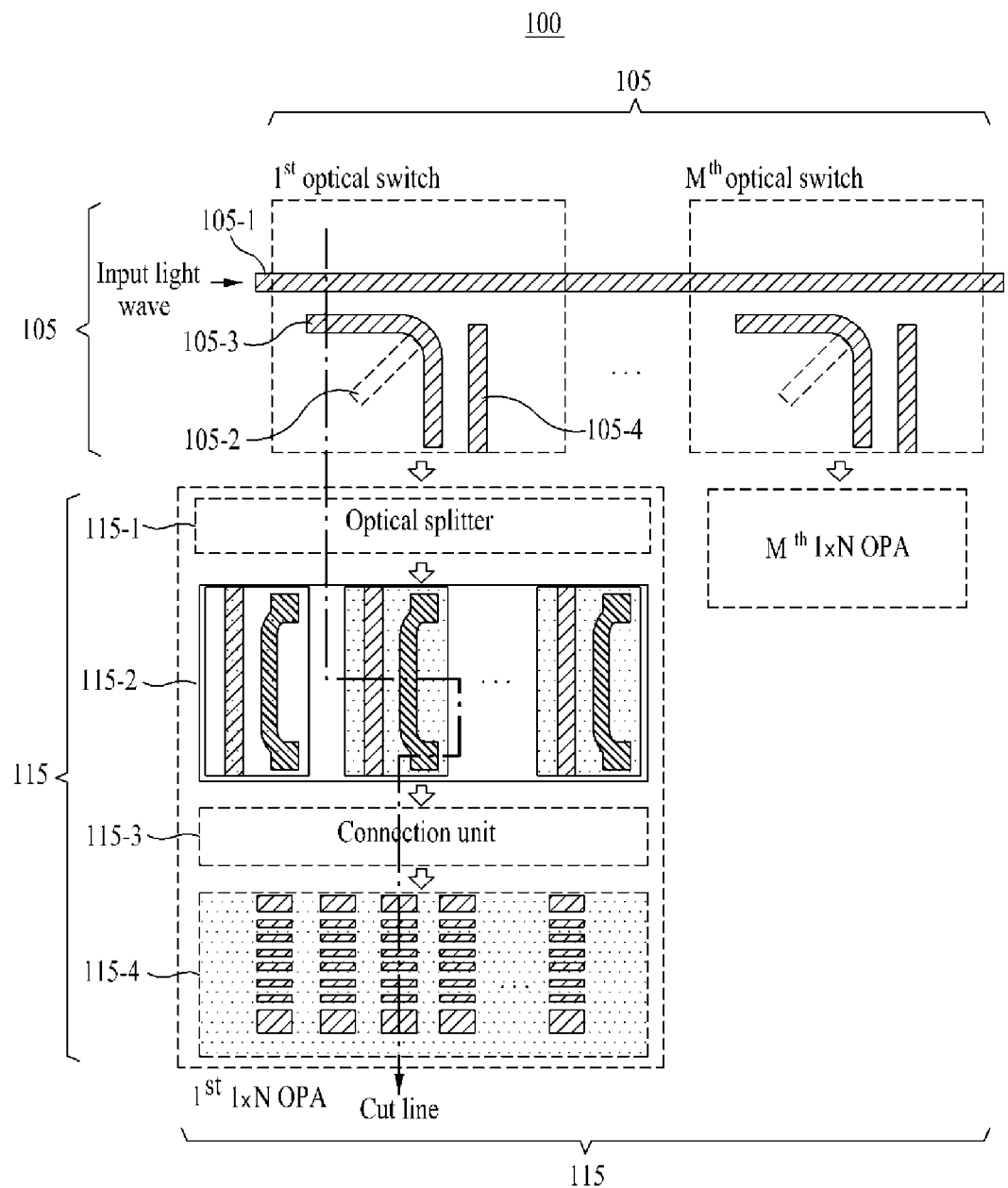
FIG. 1A is a plan view illustrating an optical phased array chip according to an embodiment.

Hereinafter embodiments of the inventive concept will be described in detail with reference to the accompanying drawings. However, it should be understood that the inventive concept is not limited to the following embodiments. In addition, the same reference numerals used in each drawing represent the same elements.

In addition, terminologies used herein are defined to appropriately describe the exemplary embodiments of the inventive concept and thus may be changed depending on a viewer, the intent of an operator, or a custom. Accordingly, the terminologies must be defined based on the following overall description of this disclosure.

Figure 2A:
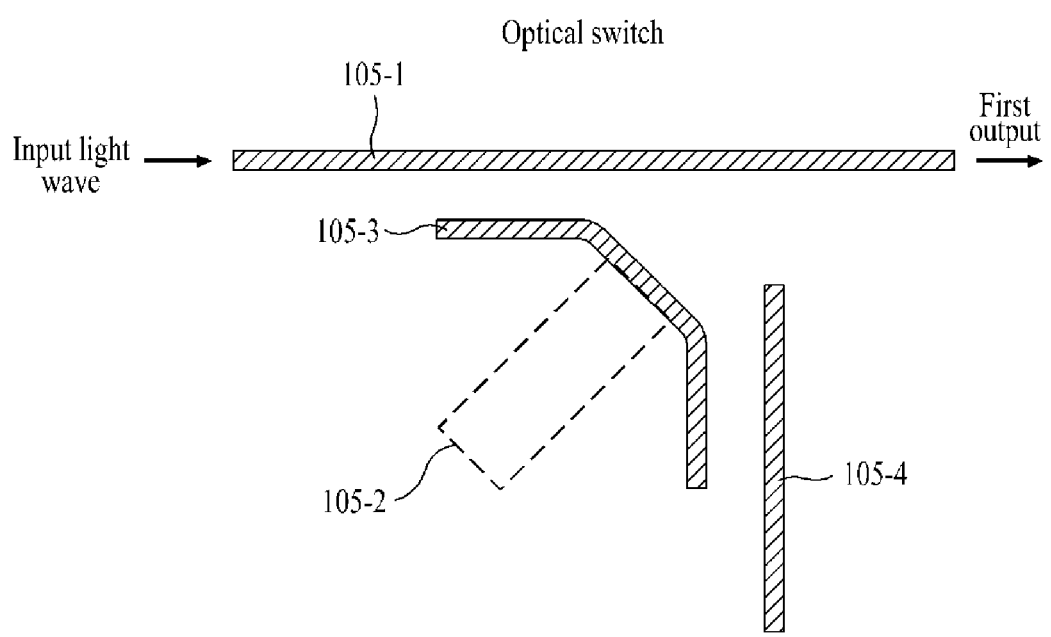
FIG. 2A is a diagram illustrating that each of a plurality of optical switches included in the optical phased array chip illustrated in FIGS. 1A and 1B operates in a bypass state.
Figure 2B:
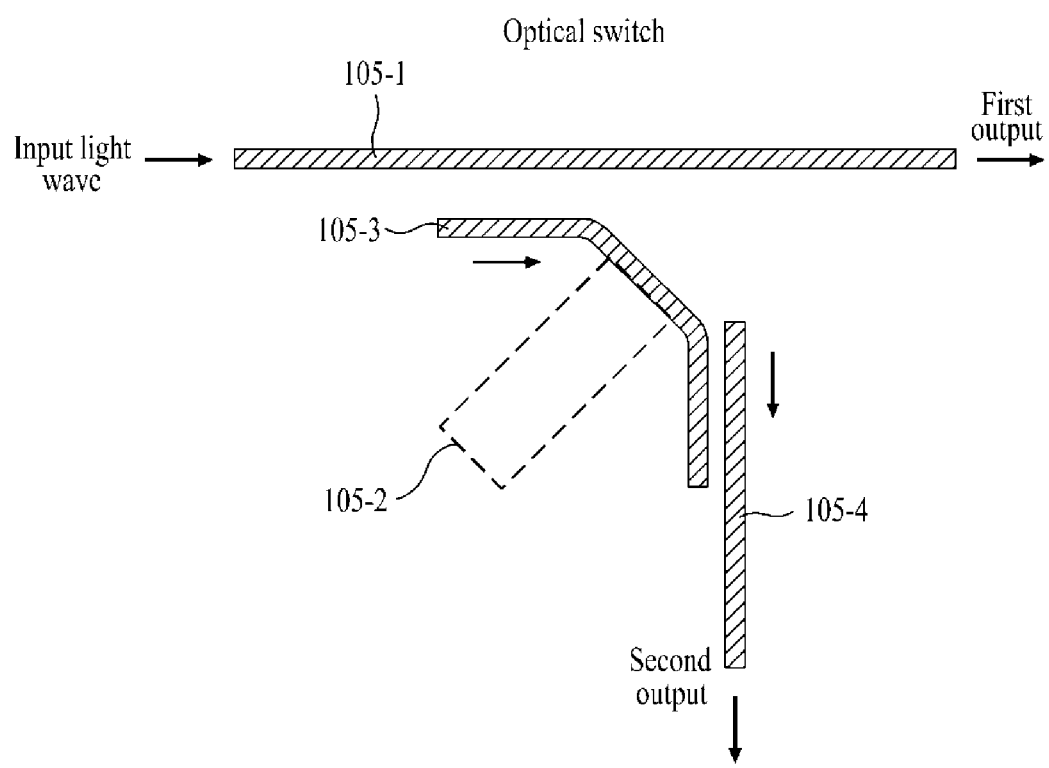
FIG. 2B is a diagram illustrating that each of a plurality of optical switches included in the optical phased array chip illustrated in FIGS. 1A and 1B operates in a branched state.

FIG. 1A is a plan view illustrating an optical phased array chip according to an embodiment. FIG. 1B is a side cross-sectional view of an optical phased array chip taken along a cutting line denoted in FIG. 1A. FIG. 2A is a diagram illustrating that each of a plurality of optical switches included in the optical phased array chip illustrated in FIGS. 1A and 1B operates in a bypass state. FIG. 2B is a diagram illustrating that each of a plurality of optical switches included in the optical phased array chip illustrated in FIGS. 1A and 1B operates in a branched state.

Referring to FIGS. 1A to 2B, an optical phased array chip 100 according to an embodiment includes a plurality of optical switches 105 based on a micro electro mechanical system (MEMS) and a plurality of optical phased arrays (OPA) 115 thermally isolated.

In this case, the optical phased array chip 100 may be implemented by integrally forming the plurality of optical switches 105 and the plurality of optical phased arrays 115 on a single integrated circuit that includes a silicon substrate 110, a lower layer 120 formed on an upper portion of the silicon substrate 110, a silicon layer 130 formed on an upper portion of the lower layer 120, a first upper layer 140, a second upper layer 150 and a third upper layer 160 that are sequentially arranged on an upper portion of the silicon layer 130, and an electrode 170 that penetrates through the first upper layer 140 while being grounded to the silicon layer 130 and is formed on an upper portion of the first upper layer 140.

Hereinafter, the number of the plurality of optical switches 105 included in the optical phased array chip 100 will be described as 'M' corresponding to the number of the plurality of optical phased arrays 115, and the scale of each of the plurality of optical phased arrays 115 will be described as 1×N. That is, the optical phased array chip 100 may be configured in two dimensions of M×(1×N) scale.

In addition, hereinafter, although it is described that the optical phased array chip 100 includes the plurality of optical switches 105 and the plurality of optical phased arrays 115, the embodiment is not restricted or limited thereto. The optical phased array chip 100 may further include a light source (not shown) that inputs an optical wave to the optical phased array chip 100, an optical fiber coupler (not shown) that couples the optical wave from the light source to an input terminal of the optical phased array chip 100, and a CMOS electronic integrated circuit, and the like. In this case, as well as the plurality of optical switches 105 and the plurality of optical phased arrays 115, the light source, the optical fiber coupler, the CMOS electronic integrated circuit, and the like may be integrally formed on a single integrated circuit.

As such, the optical phased array chip 100 may include "M" optical switches 105 for selectively connecting the input optical wave to "M" optical phased arrays 115 (hereinafter, the optical switches 105 are based on a 1×2 MEMS optical switch selectively maintained in either a bypass state or a branching state as a basic unit), and "M" optical phased arrays 115 each having a scale of 1×N to radiate optical waves transmitted from the M optical switches 105 in a preset horizontal direction and a vertical direction, thereby extending the limited longitudinal steering range ($\Delta\theta_\perp$) to the M-scale.

The plurality of optical switches 105 may be serially connected by a bus waveguide 105-1 through which an input optical wave travels. Each of the plurality of optical switches 105 may include an MEMS actuator 105-2, a coupling waveguide 105-3 driven by the MEMS actuator 105-2 and a branch waveguide 105-4 for transmitting optical waves to each of the plurality of optical phased arrays 115 in response to the driving of the coupling waveguide 105-3.

Describing the switching operation of each of the plurality of optical switches 105, each of the plurality of optical switches 105 may keep the coupling waveguide 105-3 spaced apart from the bus waveguide 105-1 and the branch waveguide 105-4 by a sufficient distance in a bypass state as shown in FIG. 2A. Accordingly, the optical wave input to the bus waveguide 105-1 may be transmitted to the next optical switch currently connected to the optical switch through the bus waveguide 105-1 without optical loss. As such, in each of the optical switches 105 in the bypass state, the optical wave is not coupled to the coupling waveguide 105-3, so that optical crosstalk transmitted to the branch waveguide 105-4 may not be caused.

In the branching state as shown in FIG. 2B, each of the plurality of optical switches 105 may bring the coupling waveguide 105-3 close to the bus waveguide 105-1 and the branch waveguide 105-4 by using the MEMS actuator 105-2 to transmit the optical wave propagating to the bus waveguide 105-1 through the first optical coupling to the coupling waveguide 105-3, and may transmit the optical wave transmitted to the coupling waveguide 105-3 through the second optical coupling to each of the plurality of optical phased arrays 115 connected to the branch waveguide 105-4.

As described above, as controlled between the bypass state and the branching state by the MEMS actuator—105-2, the optical switch connected to the selected optical phased array among the plurality of optical switches 105 may perform a switching operation in the branching state to transmit optical waves to the selected optical phased array, and the optical switch connected to the unselected optical phased array may perform a switching operation in the bypass state to prevent optical crosstalk in which the optical wave is transmitted to the unselected optical phased array.

The bus waveguide 105-1, the coupling waveguide 105-3 and the branch waveguide 105-4 that connect and constitute each of the plurality of optical switches 105 may be formed on the silicon layer 130 in a first opening 105-5 in which the first upper layer 140, the second upper layer 150, and the third upper layer 160 of the single integrated circuit are etched.

Each of the plurality of optical phased arrays 115 may include an optical splitter 115-1, a plurality of phase controller arrays 115-2, a connection unit 115-3, and a plurality of optical antenna arrays 115-4.

The optical splitter 115-1 may split the optical wave transmitted from each of the plurality of optical switches 105. In more detail, the optical splitter 115-1 may split the optical wave transmitted from each of the plurality of optical switches 105 into 'N', which is the number of channels of the plurality of phase controller arrays 115-2.

The plurality of phase controller arrays 115-2 may receive the optical waves branched by the optical splitter 115-1 to control the phase, respectively. For example, the plurality of phase controller arrays 115-2 may control the phases of optical waves transmitted to "N" channels to determine a horizontal radiation angle of a beam emitted from the plurality of optical antenna arrays 115-4. Accordingly, the transverse directionality of the divergent beam emitted by the plurality of optical antenna arrays 115-4 may be adjusted based on the phase control of the plurality of phase controller arrays 115-2.

Each of the plurality of phase controller arrays 115-2 described above may include a rib waveguide 115-6 and a resistance line 115-7 formed on the silicon layer 130 in a second opening 115-5 in which the first upper layer 140, the second upper layer 150, and the third upper layer 160 of the single integrated circuit are etched, the electrode 170 formed on an upper portion of the first upper layer 140 in a third opening 115-8 in which the second upper layer 150 and the third upper layer 160 are etched, and a ground unit 115-9 formed on the silicon layer 130 to connect the electrode 170 and the resistance line 115-7.

In particular, each of the plurality of phase controller arrays 115-2 has a resistor buried phase control structure in which thermal isolation of each of the plurality of phase controller arrays 115-2 is formed through the second opening 115-5. In more detail, the rib waveguide 115-6 and the resistance line 115-7 may be supported by a support portion 120-1 formed by etching a portion of the lower layer 120 and be buried in the second opening 115-5, so that the resistor buried phase control structure is implemented. Accordingly, the plurality of phase controller arrays 115-2 may improve phase control efficiency by minimizing mutual thermal interference and suppressing unnecessary heat conduction.

The width of the electrode 170 included in each of the plurality of phase controller arrays 115-2 and the width of the second upper layer 150 etched in the third opening 115-8 may be wider than the width of the third upper layer 160 etched in the third opening 115-8 for the grounding of the electrode 170.

The connection unit 115-3 may transmit optical waves output from the plurality of phase controller arrays 115-2 to the plurality of optical antenna arrays 115-4.

The plurality of optical antenna arrays 115-4 may radiate the optical waves transmitted by the connection unit 115-3 into free space according to a preset longitudinal steering range. In this case, the plurality of optical antenna arrays 115-4 may be provided at an N-scale corresponding to the number (N) of channels of the plurality of phase controller arrays 115-2, and each of the plurality of optical antenna arrays 115-4 may be configured as a grating coupler formed on the silicon layer 130 to radiate an optical wave into free space. For example, each of the plurality of optical antenna arrays 115-4 may be composed of a thermo-optic tunable grating on the silicon layer 130 to have a vertical steering range ($\Delta\theta_\perp$) of 10°.

In addition, as described above, the plurality of optical antenna arrays 115-4 may adjust the lateral directionality of the diverging beam formed by the optical waves according to the phase relationship between the plurality of phase controller arrays 115-2 in response to the control of the phases of the optical waves by the plurality of phase controller arrays 115-2.

As described above, the plurality of optical phased arrays 115 according to an embodiment may minimize unnecessary opening and include only the first opening 105-5 of the plurality of optical switches 105 and the second opening 115-5 and the third opening 115-8 of each of the plurality of phase controller arrays 115-2, so that it is possible to introduce a local opening forming process. In such an opening forming process (the process in which the first opening 105-5, the second opening 115-5, and the third opening 115-8 are etched), the third upper layer 160 may be used as a passivation layer to protect regions other than the described openings (the first opening 105-5, the second opening 115-5, and the third opening 115-8).

Hereinafter, a method of manufacturing the described optical phased array chip 100 will be described.

FIG. 3 is a flowchart illustrating a method of manufacturing an optical phased array chip according to an embodiment. FIGS. 4A to 4F are side cross-sectional views of an optical phased array chip for explaining the manufacturing method illustrated in FIG. 3. Hereinafter, the subject performing the manufacturing method may be an automated and mechanized manufacturing system, and an optical phased array chip manufactured as a result of performing the manufacturing method may have the structure described with reference to FIGS. 1A to 1B.

Referring to FIGS. 3 and 4A to 4D, first, in operation S310, the manufacturing system may prepare a semiconductor structure 410 that includes a silicon substrate 401, a lower layer 402 formed on an upper portion of the silicon substrate 401, and a silicon layer 403 formed on an upper portion of the lower layer 402.

In this case, the lower layer 402 may be formed of a material having a refractive index lower than that of a material constituting the silicon substrate 401 or a material constituting the silicon layer 403.

Figure 4A:
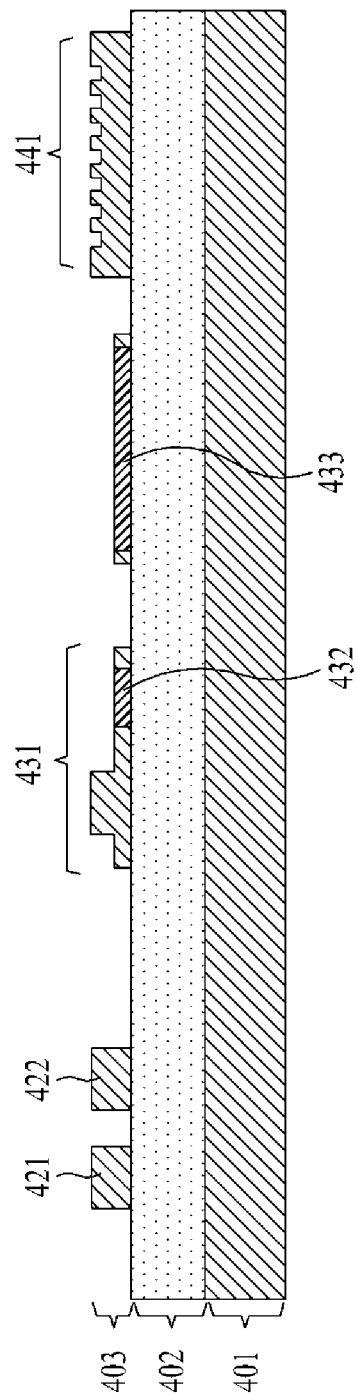
FIGS. 4A to 4F are side cross-sectional views of an optical phased array chip for explaining the manufacturing method illustrated in FIG. 3.

Then, as shown in FIG. 4A, in operation S320, the manufacturing system may form a bus waveguide 421, a coupling waveguide 422, a branch waveguide, a rib waveguide 431, and a grating coupler 441 on the silicon layer 403.

In addition, as shown in FIG. 4A, in operation S320, the manufacturing system may form a resistance line 432 and a ground unit 433 through an ion implantation process in the slab region on the silicon layer 403.

Figure 4B:
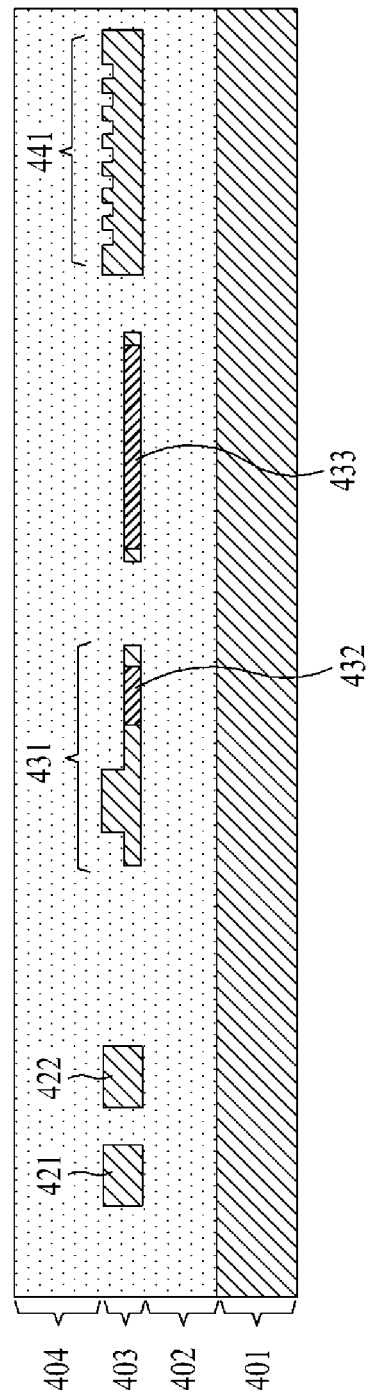

Then, as shown in FIG. 4B, in operation S330, the manufacturing system may arrange a first upper layer 404 on an upper portion of the silicon layer 403.

In this case, the first upper layer 404 may be formed by depositing a material having a lower refractive index than a material constituting the silicon layer 403.

Figure 4C:
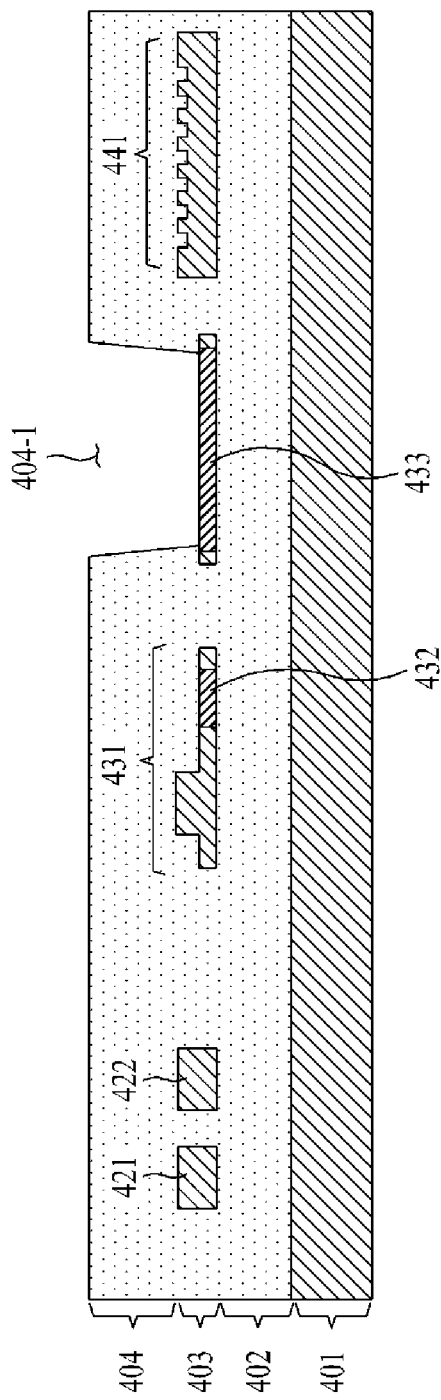

Next, as shown in FIG. 4C, in operation S340, the manufacturing system may etch a via hole 404-1 in the region corresponding to the ground unit 433 of the first upper layer 404.

Figure 4D:
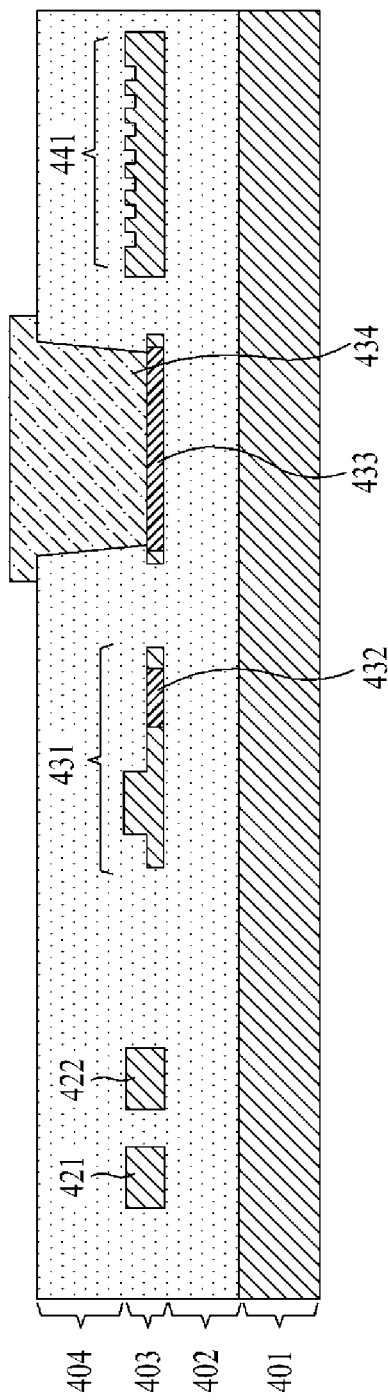

Next, as shown in FIG. 4D, in operation S350, the manufacturing system may form an electrode 434 by depositing a conductive material in the via hole 404-1.

Figure 4E:
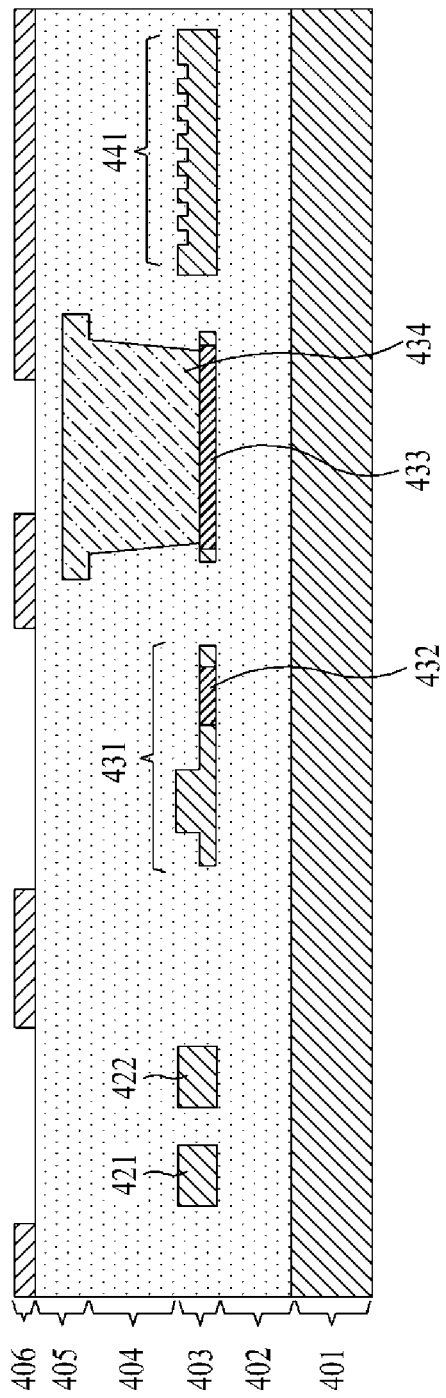

Next, as shown in FIG. 4E, in operation S360, the manufacturing system may sequentially arrange a second upper layer 405 and a third upper layer 406 on an upper portion of the first upper layer 404 in which the electrode 434 is formed.

Figure 4F:
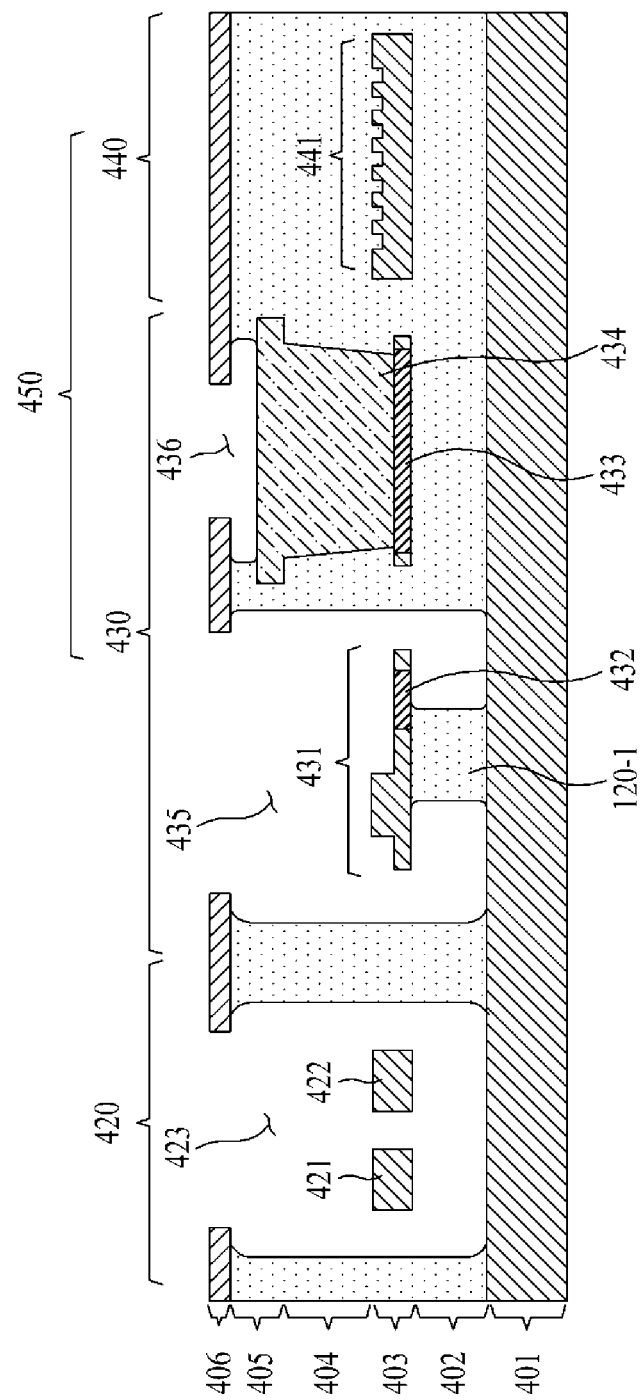

Next, as shown in FIG. 4F, in operation S370, the manufacturing system may locally etch a region corresponding to the bus waveguide 421, the coupling waveguide 422 and the branch waveguide among the third upper layer 406, the second upper layer 405 and the first upper layer 404 to form a first opening 423, thereby implementing a plurality of optical switches 420 each including the bus waveguide 421, the coupling waveguide 422 and the branch waveguide.

The plurality of optical switches 420 implemented in the first opening 423 by performing operation S370 may be placed on the channel waveguide that includes the bus waveguide 421, the coupling waveguide 422 and the branch waveguide through operation S320.

The coupling waveguide 422 of the plurality of optical switches 420 has an empty space around it by the first opening 423 in a state of being supported by a partial support of the lower layer 402, so that the coupling waveguide 422 may be displaced in the transverse direction in a branching operation.

Then, as shown in FIG. 4F, in operation S380, the manufacturing system forms a second opening 435 by locally etching the region corresponding to the rib waveguide 431 and the resistance line 432 among the third upper layer 406, the second upper layer 405 and the first upper layer 404, forms a third opening 436 by locally etching a region corresponding to the electrode 434 and the ground unit 433 among the second upper layer 405 and the third upper layer 406, constructs a plurality of phase controller arrays 430 each including the rib waveguide 431, the resistance line 432, the electrode 434 and the ground unit 433, and constructs a plurality of optical antenna arrays 440 each including the grating coupler 441, thereby implementing a plurality of optical phased arrays 450 each including the plurality of phase controller arrays 430 and the plurality of optical antenna arrays 440.

In this case, the third upper layer 406 may be made of a material serving as an etch mask having a high selectivity in the etching process of the openings 435 and 436, and when a silicon oxide sacrificial layer is applied, may be made of $Al_2O_3$.

The plurality of phase controller arrays 430 implemented in the second opening 435 and the third opening 436 by performing operation S380 may be placed on the rib waveguide 431 through operation S320.

The rib waveguide 431 and the resistance line 432 of the plurality of phase controller arrays 430 may be provided with the empty space around the second opening 435 in the state of being supported by some supports of the lower layer 402, thereby realizing thermal isolation.

As described above, the process of implementing the plurality of optical switches 420 may be performed by utilizing the process of implementing the plurality of optical phased arrays 450, and as a result, the plurality of optical switches 420 and the plurality of optical phased arrays 450 may be integrally formed on a single optical chip.

The embodiments provide an optical phased array chip of a two-dimensional optical phased array that utilizes a micro electro mechanical system (MEMS) optical switch and a method of manufacturing the same, so that it is possible to expand the longitudinal divergence angle of a diverging beam while overcoming a limitation of a conventional two-dimensional optical phased array utilizing optical switches of an electro-optic or thermo-optic scheme.

In detail, the embodiments provide an optical phased array chip that includes a plurality of optical phased arrays including a plurality of MEMS-based optical switches implemented on a single integrated circuit and a plurality of thermal-isolated phase controller arrays, and a method of manufacturing the same.

Accordingly, the optical phased array chip according to an embodiment utilizes the MEMS optical switch to selectively transmit optical waves to a selected optical phased array without optical crosstalk, in which an optical wave is introduced into an unselected optical phased array.

In this case, the method of manufacturing an optical phased array chip according to embodiments may apply a local opening forming process limited to the plurality of optical switches and the plurality of phase controller arrays in order to prevent unnecessary performance degradation by applying the opening forming process to components that do not require opening formation, such as a light splitter and a plurality of optical antenna arrays when the optical phased array chip is manufactured.

In addition, the optical phased array chip according to an embodiment provides the resistor buried phase control structure in which the opening region formed in the plurality of phase controller arrays is thermally isolated, so that thermal interference may be minimized and unnecessary heat conduction may be suppressed, thereby improving phase control efficiency.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Thus, it is intended that the inventive concept covers other realizations and other embodiments of this invention provided they come within the scope of the appended claims and their equivalents.

What is claimed is:

1. An optical phased array chip comprising:
a plurality of optical switches and a plurality of optical phased arrays implemented on a single integrated circuit,
wherein the single integrated circuit includes:
a silicon substrate;
a lower layer formed on an upper portion of the silicon substrate;
a silicon layer formed on an upper portion of the lower layer;
a first upper layer, a second upper layer and a third upper layer sequentially arranged on the silicon layer; and
an electrode that penetrates through the first upper layer while being grounded to the silicon layer and is formed on an upper portion of the first upper layer.

2. The optical phased array chip of claim 1, wherein the plurality of optical switches are connected in series with a bus waveguide through which an input optical wave proceeds, and
wherein each of the plurality of optical switches includes:
an MEMS actuator;
a coupling waveguide driven by the MEMS actuator; and
a branch waveguide that transmits the optical wave to each of the plurality of optical phased arrays in response to the coupling waveguide being driven.

3. The optical phased array chip of claim 2, wherein the coupling waveguide and the branch waveguide included in each of the bus waveguide and the plurality of optical switches are formed on the silicon layer in a first opening in which the first upper layer, the second upper layer and the third upper layer are etched.

4. The optical phased array chip of claim 2, wherein the coupling waveguide is configured to transmit an optical wave propagating to the bus waveguide through a first optical coupling to the coupling waveguide, and transmit the optical wave transmitted through a second optical coupling to the coupling waveguide to each of the plurality of optical phased arrays as the coupling waveguide approaches the bus waveguide and the branch waveguide by the MEMS actuator.

5. The optical phased array chip of claim 1, wherein each of the plurality of optical phased arrays includes:
an optical splitter configured to split an optical wave transmitted from each of the plurality of optical switches;
a plurality of phase controller arrays configured to receive the optical waves branched by the optical splitter, respectively to control a phase;
a connection unit configured to transmit optical waves output from the plurality of phase controller arrays to a plurality of optical antenna arrays; and
the plurality of optical antenna arrays configured to radiate the optical waves transmitted by the connection unit according to a preset longitudinal steering range.

6. The optical phased array chip of claim 5, wherein each of the plurality of phase controller arrays includes:
a rib waveguide and a resistance line formed on the silicon layer in a second opening in which the first upper layer, the second upper layer and the third upper layer are etched;
the electrode formed on an upper portion of the first upper layer in a third opening in which the second upper layer and the third upper layer are etched; and
a ground unit formed on the silicon layer to connect the electrode and the resistance line.

7. The optical phased array chip of claim 6, wherein a width of the electrode and a width of a portion of the second upper layer which is etched in the third opening are wider than a width of a portion of the third upper layer which is etched in the third opening to ground the electrode.

8. The optical phased array chip of claim 6, wherein each of the plurality of phase controller arrays has a resistor buried phase control structure in which the rib waveguide and the resistance line are buried in the second opening for thermal isolation of each of the plurality of phase controller arrays.

9. The optical phased array chip of claim 4, wherein each of the plurality of optical antenna arrays is configured with a grating coupler formed on the silicon layer.

10. The optical phased array chip of claim 4, wherein each of the plurality of optical antenna arrays is configured to adjust lateral directionality of a divergent beam formed by the optical waves according to a phase relationship between the plurality of phase controller arrays.

11. The optical phased array chip of claim 1, wherein the third upper layer is used as a passivation layer for protecting areas other than a first opening, a second opening and a third opening on the single integrated circuit in a process of etching the first opening in which the plurality of optical switches are formed, the second opening and the third opening in which the plurality of optical phased arrays are formed.

12. A method of manufacturing an optical phased array chip, the method comprising:
    preparing a semiconductor structure including a silicon substrate, a lower layer formed on an upper portion of the silicon substrate, and a silicon layer formed on an upper portion of the lower layer;
    forming a bus waveguide, a coupling waveguide, a branch waveguide, a rib waveguide, and a grating coupler on the silicon layer;
    forming a resistance line and a ground unit in a slab region on the silicon layer through an ion implantation process;
    disposing a first upper layer on an upper portion of the silicon layer;
    forming a via hole by etching an area corresponding to the ground unit of the first upper layer;
    forming an electrode by depositing a conductive material in the via hole;
    sequentially disposing a second upper layer and a third upper layer on an upper portion of the first upper layer in which the electrode is formed;
    implementing a plurality of optical switches each including the bus waveguide, the coupling waveguide, and the branch waveguide by forming a first opening by etching areas corresponding to the bus waveguide, the coupling waveguide and the branch waveguide among the third upper layer, the second upper layer and the first upper layer; and
    implementing a plurality of optical phased arrays each including a plurality of phase controller arrays and a plurality of optical antenna arrays by forming the plurality of phase controller arrays each including the rib waveguide, the resistance line, the electrode, and the ground unit, and by forming the plurality of optical antenna arrays each including the grating coupler, wherein areas corresponding to the rib waveguide and the resistance line among the third upper layer, the second upper layer and the first upper layer are etched to form a second opening, and wherein areas corresponding to the electrode and the ground unit of the second upper layer and the third upper layer are etched to form a third opening.

* * * * *